(12) United States Patent
Nakayama et al.

(10) Patent No.: US 6,721,213 B2
(45) Date of Patent: Apr. 13, 2004

(54) ELECTRONIC CIRCUIT AND SEMICONDUCTOR STORAGE DEVICE

(75) Inventors: Atsushi Nakayama, Tokyo (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/229,162

(22) Filed: Aug. 28, 2002

(65) Prior Publication Data
US 2003/0042955 A1 Mar. 6, 2003

(30) Foreign Application Priority Data
Aug. 30, 2001 (JP) ........................................ 2001-261160

(51) Int. Cl.[7] ................................................ G11C 7/00
(52) U.S. Cl. .................... 365/194; 365/189.11; 327/262
(58) Field of Search ............................ 365/194, 189.11, 365/189.08, 230.06; 327/262, 270

(56) References Cited
U.S. PATENT DOCUMENTS 5,485,114 A    1/1996  Funakura et al. ........... 327/262
6,134,182 A  * 10/2000  Pilo et al. .................... 365/194
6,473,468 B1 * 10/2002  Do .............................. 365/194
6,483,769 B2 * 11/2002  La .............................. 365/194
6,519,188 B2 *  2/2003  Ryoo et al. .................. 365/194

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

An electronic circuit according to this invention includes a first delay compensation circuit which receives a first power supply voltage and a first signal and outputs a first output signal delayed by a first predetermined time, a second delay compensation circuit which receives a second power supply voltage and the first signal and outputs a second output signal delayed by a second predetermined time, a first logic circuit which receives the first power supply voltage and the second output signal output from the second delay compensation circuit and outputs a first operation result by performing first logic operation, and a second logic circuit which receives the second power supply voltage and the first output signal output from the first delay compensation circuit and outputs a second operation result by performing second logic operation.

23 Claims, 15 Drawing Sheets

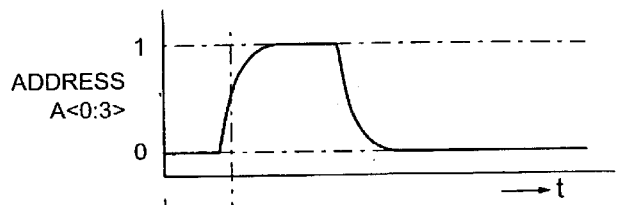
FIG. 7A ADDRESS A<0:3>
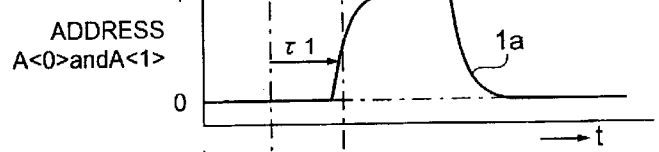
FIG. 7B ADDRESS A<0>andA<1>
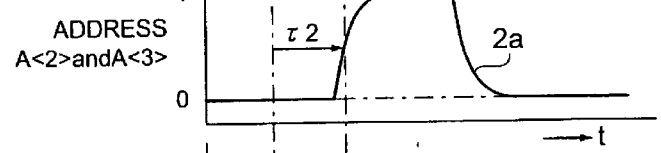
FIG. 7C ADDRESS A<2>andA<3>
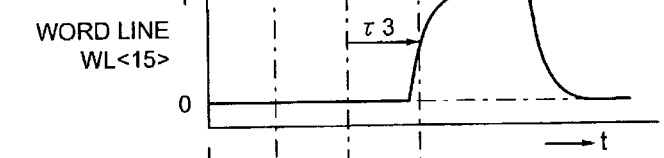
FIG. 7D WORD LINE WL<15>
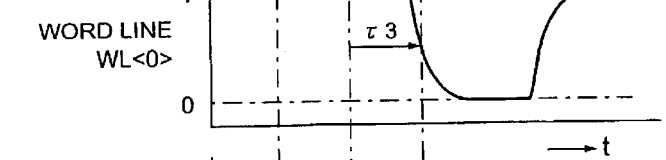
FIG. 7E WORD LINE WL<0>
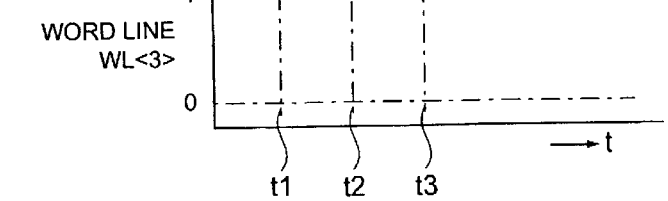
FIG. 7F WORD LINE WL<3>

FIG. 8A ADDRESS A<0:3>
FIG. 8B ADDRESS A<0>andA<1>
FIG. 8C ADDRESS A<2>andA<3>
FIG. 8D WORD LINE WL<15>
FIG. 8E WORD LINE WL<0>
FIG. 8F WORD LINE WL<3>
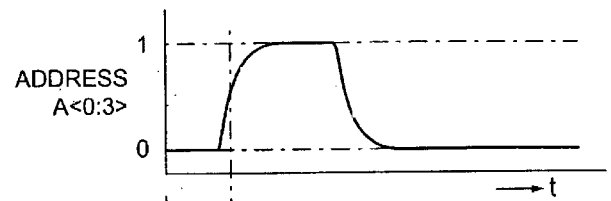
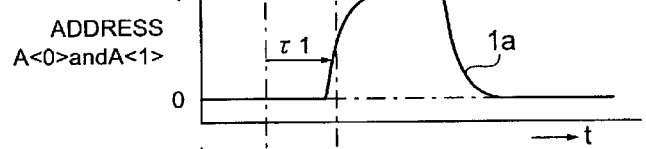
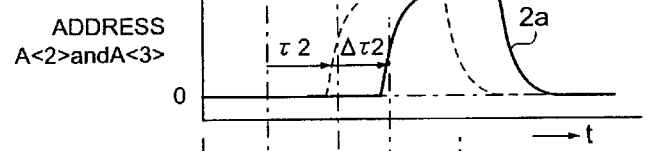
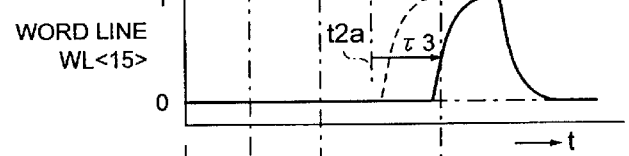
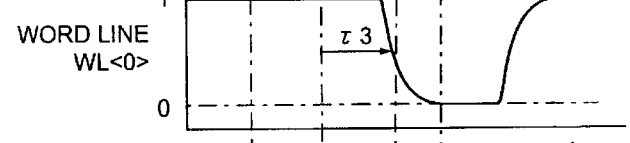
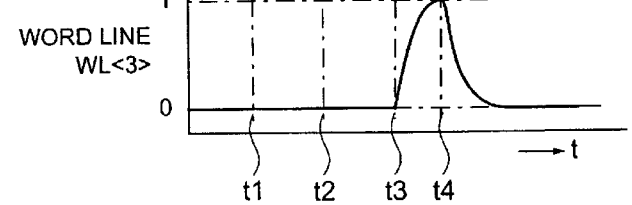

ADDRESS A<0:3>

ADDRESS A<0>andA<1>

ADDRESS A<2>andA<3>

WORD LINE WL<15>

WORD LINE WL<0>

WORD LINE WL<3>

ELECTRONIC CIRCUIT AND SEMICONDUCTOR STORAGE DEVICE

CROSS REFERENCE TO RELATED APPLICATION

This application is based upon and claims the benefit of priority under 35 USC 119 from the prior Japanese Patent Application No. 2001-261160, filed on Aug. 30, 2001, the entire contents of which are incorporated herein by reference.

BACKGROUND OF THE INVENTION

The present invention relates to an electronic circuit and semiconductor storage device.

Recently, with an increase in the integration degree of semiconductor circuits, attempts have been made to attain improvements in the performance of semiconductor devices, e.g., an improvement in function, a reduction in area, an increase in speed, and a reduction in power consumption. Such advances greatly depend on a reduction in the size of MOS transistors.

In order to reduce the size of a MOS transistor, it is necessary to achieve a reduction in power supply voltage. This is because a reduction in power supply voltage makes it possible to decrease the thickness of the gate oxide film of the MOS transistor and suppress the short channel effect in the MOS transistor. On the other hand, this low-voltage MOS transistor cannot be connected to a high-voltage power supply or signal line.

In addition, a chip includes circuits whose power supply voltages should not be decreased. For example, such circuits are an I/O cell for controlling input/output operation of a single line with respect to the outside of the chip, an analog circuit, and the selection gate of a memory cell in a semiconductor storage device such as a DRAM.

Under the circumstances, a method of applying a plurality of power supply voltages to one chip is employed. In addition, it is recently becoming common practice to attain improvements in characteristics by forming a plurality of types of high- and low-voltage transistors on a single chip and optimizing each transistor.

It is more difficult to attain a reduction in size of a high-voltage transistor than a low-voltage transistor. The effort in design can be reduced by uniformly applying a high power supply voltage to an I/O cell, analog circuits, and the like and using high-voltage transistors, but it must trade off occupied area, operation speed, power consumption, and the like. In order to achieve such an improvement in the performance of a circuit, flexible design is required, e.g., applying a high power supply voltage to only necessary portions and using high-voltage transistors for them while applying a low power supply voltage to a control circuit and high-speed signal path and using low-voltage transistors for them.

One of the problems that arise in such a case is how to match circuit characteristics associated with operation speed and the like between a high-voltage circuit and a low voltage-circuit.

As a method associated with the present invention in a case wherein multiple power supply voltages are used, a method of receiving one power supply voltage from the outside and internally generating the remaining necessary power supply voltages is available. This technique has been used mainly in semiconductor storage devices. A merit of this technique is that the internally generated power supply voltages can be controlled depending on the externally applied power supply voltage. This makes it possible to suppress any circuit characteristic mismatch caused when a plurality of power supply voltages independently vary. According to this technique, however, an internal power supply circuit requires a large area, and hence an increase in integration degree is hindered. Although the technique can suppress independent variations in power supply voltage, it cannot cope with circuit characteristic mismatches caused when the characteristics of a plurality of types of transistors independently vary due to process variations and the like.

The above technique associated with the present invention cannot eliminate the mismatch caused in circuits that independently operate upon receiving a plurality of power supply voltages applied externally or mismatches caused when the characteristics of a plurality of transistors independently vary without hindering an increase in operation speed.

SUMMARY OF THE INVENTION

According to one aspect of the invention, there is provided an electronic circuit comprising a first delay compensation circuit which receives a first power supply voltage and a first signal and outputs a first output signal delayed by a first predetermined time, a second delay compensation circuit which receives a second power supply voltage and the first signal and outputs a second output signal delayed by a second predetermined time, a first logic circuit which receives the first power supply voltage and the second output signal output from the second delay compensation circuit and outputs a first operation result by performing first logic operation, and a second logic circuit which receives the second power supply voltage and the first output signal output from the first delay compensation circuit and outputs a second operation result by performing second logic operation.

According to another aspect of the invention, there is provided an electronic circuit comprising a first delay compensation circuit which receives a first power supply voltage, includes a transistor having a first characteristic, receives a first signal, and outputs a first output signal delayed by a first predetermined time, a second delay compensation circuit which receives a second power supply voltage, includes a transistor having a second characteristic, receives a second signal, and outputs a second output signal delayed by a second predetermined time, a first logic circuit which receives the first power supply voltage and the second output signal output from the second delay compensation circuit, performs first logic operation, and outputs a first operation result, and a second logic circuit which receives the first power supply voltage and the first output signal output from the first delay compensation circuit, performs second logic operation, and outputs a second operation result.

According to another aspect of the invention, there is provided an electronic circuit comprising a first level shifter which receives a first signal that has a second voltage at high level, boosts the second voltage to a first voltage, and outputs the first signal, a first delay compensation circuit which receives a first power supply voltage having the first voltage and the first signal output from the first level shifter and outputs a first output signal delayed by a first predetermined time, a second level shifter which receives the first output signal that has the first voltage at high level and output from the first delay compensation circuit, boosts the first voltage to the second voltage, and outputs the first output signal, a second delay compensation circuit which receives the second power supply voltage and the first signal that has the second voltage at high level and outputs a second output signal delayed by a second predetermined time, a third level shifter which receives the second output signal output from the second delay compensation circuit and boosts the second voltage of the second output signal of high level to the first voltage, a first logic circuit which receives the first power supply voltage and the second output signal output from the third level shifter, performs first logic operation, and outputs a first operation result, and a second logic circuit which receives the second power supply voltage having the second voltage and the first output signal output from the second level shifter, performs second logic operation, and outputs a second operation result.

According to another aspect of the invention, there is provided a semiconductor storage device comprising a memory cell array having a plurality of memory cells connected to a plurality of bit lines, column selection gates each provided for a corresponding one of the bit lines to select the bit line, a column decoder which generates a column selection signal for selectively driving the column selection gates, data buffers each of which is provided for a corresponding one of the column selection gates, receives data output from the corresponding column selection gate, and amplifies and outputs the data, a data buffer control logic circuit which generates a data buffer driving signal for selectively driving the data buffers, a first delay compensation circuit which receives a first power supply voltage and a timing signal and outputs a first output signal delayed by a first predetermined time to the data buffer control logic circuit, and a second delay compensation circuit which receives a second power supply voltage and the timing signal and outputs a second output signal delayed by a second predetermined time to the column decoder.

According to another aspect of the invention, there is provided a semiconductor storage device comprising a memory cell array having a plurality of memory cells connected to a plurality of bit lines, column selection gates each provided for a corresponding one of the bit lines to select the bit line, a column decoder which generates a column selection signal for selectively driving the column selection gates, data buffers each of which is provided for a corresponding one of the column selection gates, receives data output from the corresponding column selection gate, and amplifies and outputs the data, a data buffer control logic circuit which generates data buffer drive signals for selectively driving said data buffer, a first level shifter which receives a timing signal that has a second voltage at high level, and outputs the timing signal upon boosting the second voltage to a first voltage, a first delay compensation circuit which receives a first power supply voltage having the first voltage and the timing signal output from the level shifter and outputs a first output signal delayed by a first predetermined time, a second level shifter which receives the first output signal that has the first voltage at high level and output from the first delay compensation circuit, and outputs the first output signal to the data buffer control logic circuit upon boosting the first voltage to the second voltage, a second delay compensation circuit which receives the second power supply voltage and the timing signal that has the second voltage at high level, and outputs a second output signal delayed by a second predetermined time, and a third level shifter which receives the second output signal output from the second delay compensation circuit, boosts the second voltage of the second output signal of high level to the first voltage, and outputs the signal to the column decoder.

According to another aspect of the invention, there is provided a semiconductor storage device comprising a memory cell array having a plurality of memory cells connected to intersections of a plurality of word lines and a plurality of bit lines, a row decoder which generates a word line selection signal for selectively driving the word lines, sense amplifiers each of which is provided for a corresponding one of the bit lines, detects data output from the corresponding bit line, and output the data, a sense amplifier control circuit which generates a sense amplifier driving signal for selectively driving the sense amplifiers, a first level shifter which receives a timing signal that has a second voltage at high level, and outputs the timing signal upon boosting the second voltage to a first voltage, a first delay compensation circuit which receives a first power supply voltage having the first voltage and the timing signal output from the level shifter and outputs a first output signal delayed by a first predetermined time, a second level shifter which receives the first output signal that has the first voltage at high level and output from the first delay compensation circuit, and outputs the first output signal to the data buffer control logic circuit upon boosting the first voltage to the second voltage, a second delay compensation circuit which receives the second power supply voltage and the timing signal that has the second voltage at high level, and outputs a second output signal delayed by a second predetermined time, and a third level shifter which receives the second output signal output from the second delay compensation circuit, boosts the second voltage of the second output signal of high level to the first voltage, and outputs the signal to the column decoder.

BRIEF DESCRIPTION OF THE DRAWINGS

FIGS. 7A, 7B, 7C, 7D, 7E, and 7F are timing charts showing changes in the waveforms of signals in an ideal state in a semiconductor storage device;

FIGS. 8A, 8B, 8C, 8D, 8E, and 8F are timing charts showing changes in the waveforms of signals in the semiconductor storage device associated with the present invention;

DETAILED DESCRIPTION OF THE EMBODIMENTS

The embodiments of the present invention will be described below with reference to the accompanying drawings.

(1) First Embodiment

Figure 1:
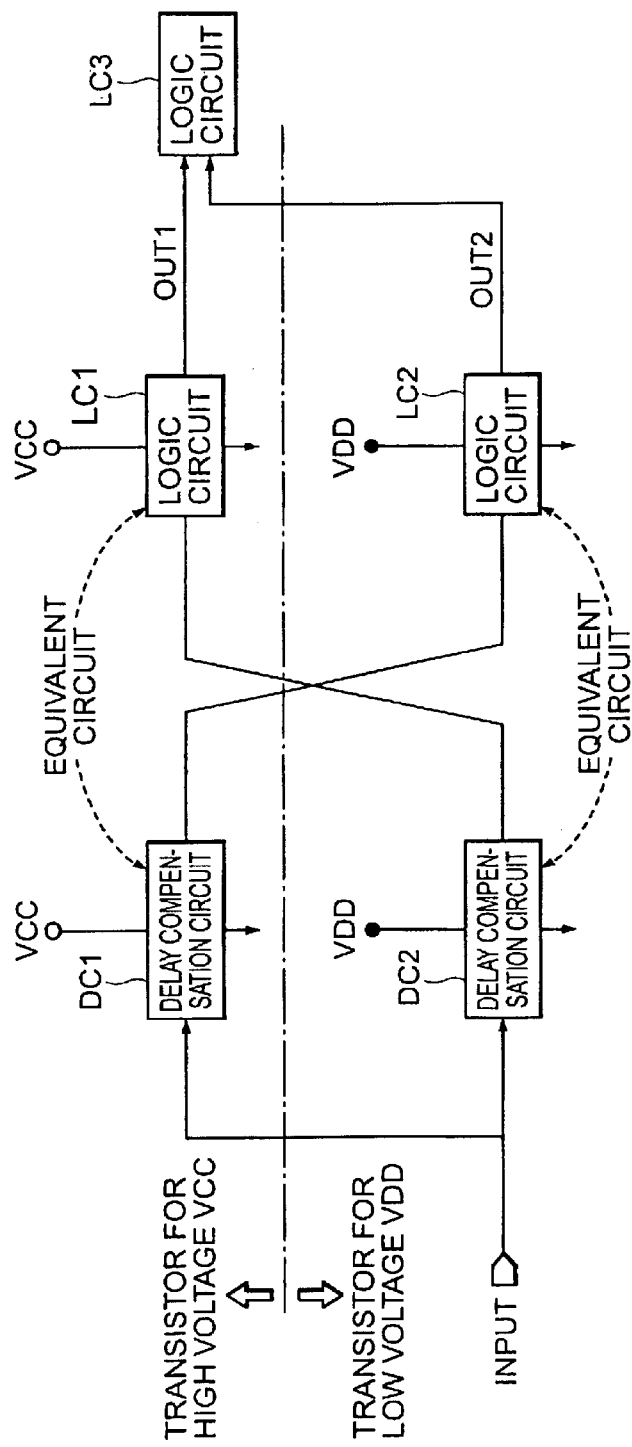
FIG. 1 is a block diagram showing the arrangement of an electronic circuit according to the first embodiment of the present invention.

An electronic circuit according to the first embodiment of the present invention will be described with reference to FIG. 1.

This embodiment includes logic circuits LC1, LC2, and LC3 which operate upon respectively receiving different power supply voltages VCC and VDD (VCC>VDD).

The logic circuit LC1 receives the power supply voltage VCC and an input signal INPUT to perform logic operation, and outputs a signal OUT1 as a result of the operation. The logic circuit LC2 receives the power supply voltage VDD and the same input signal INPUT to perform logic operation, and outputs a signal OUT2. In this case, the input signal INPUT is a signal for synchronizing the logic operations done by the logic circuits LC1 and LC2. This signal corresponds to a timing signal such as a clock. The logic circuit LC3 performs logic operation upon receiving the signal OUT1 having the same level as that of the power supply voltage VCC of high level and the signal OUT2 having the same level as that of the power supply voltage VDD of high level.

The delay time originating from circuit operation in the logic circuit LC1 depends on a variation in the power supply voltage VCC and the characteristics of the transistors constituting the logic circuit LC1. The delay time originating from circuit operation in the logic circuit LC2 depends on a variation in the power supply voltage VDD and the characteristics of the transistors constituting the logic circuit LC2.

This embodiment includes a delay compensation circuit DC1 having a circuit arrangement which is electrically equivalent to the logic circuit LC1 and causes substantially the same signal delay as that caused by the logic circuit LC1, and a delay compensation circuit DC2 having a circuit arrangement which is electrically equivalent to the logic circuit LC2 and causes substantially the same signal delay as that caused by the logic circuit LC2.

The delay compensation circuit DC1 receives the power supply voltage VCC and input signal INPUT and outputs the signal to the logic circuit LC2 after the first delay time. The delay compensation circuit DC2 receives the power supply voltage VDD and input signal INPUT and outputs the signal to the logic circuit LC1 after the second delay time.

In this case, the delay compensation circuit DC1 operates upon receiving the power supply voltage VCC common to the logic circuit LC1, and is constituted by transistors having the same characteristics as those of the transistors constituting the logic circuit LC1. The delay compensation circuit DC2 operates upon receiving the power supply voltage VDD common to the logic circuit LC2, and is constituted by transistors having the same characteristics as those of the transistors constituting the logic circuit LC2.

With this arrangement, both the signal OUT1 from the logic circuit LC1 and the signal OUT2 from the logic circuit LC2 have delay characteristics dependent on the power supply voltages VCC and VDD. Even if, therefore, the power supply voltages VCC and VDD independently vary, both the output signals OUT1 and OUT2 are delayed by similar periods of time.

In addition, both the signals OUT1 and OUT2 are delayed depending on the characteristics of the transistors constituting the logic circuits LC1 and LC2. Even if, therefore, the characteristics of the transistors of one of the logic circuits LC1 and LC2 independently vary due to variations in the manufacturing process, the signals OUT1 and OUT2 are delayed by similar periods of time.

As a consequence, the influences of independent variations in the power supply voltages VCC and VDD or the influences of the characteristics of the transistors of the logic circuits LC1 and LC2, which can independently vary due to the manufacturing processes, on the output signals OUT1 and OUT2 cancel out each other to prevent the logic circuit LC3 on the output stage from erroneously operating upon receiving the output signals OUT1 and OUT2, thereby realizing stable, high-speed circuit operation.

As described above, according to this embodiment, the delay compensation circuits DC2 and DC1 which respectively receive the power supply voltages VDD and VCC and include the transistors having the same characteristics as those of the transistors constituting the logic circuits LC2 and LC1 are respectively connected to the input sides of the logic circuits LC1 and LC2 which operate upon receiving the two kinds of power supply voltages VCC and VDD, respectively. With this arrangement, the influences of variations in the power supply voltages VCC and VDD, which can independently vary, or the influences of variations in transistor characteristics cancel out each other, and both outputs from the logic circuits LC1 and LC2 are delayed upon receiving the influences of the power supply voltages VCC and VDD or the influences of the transistor characteristics of the logic circuits LC1 and LC2. This makes it possible to prevent an operation error in the circuit connected to the output stage and attain an improvement in stability and an increase in operation speed.

(2) Second Embodiment

Figure 2:
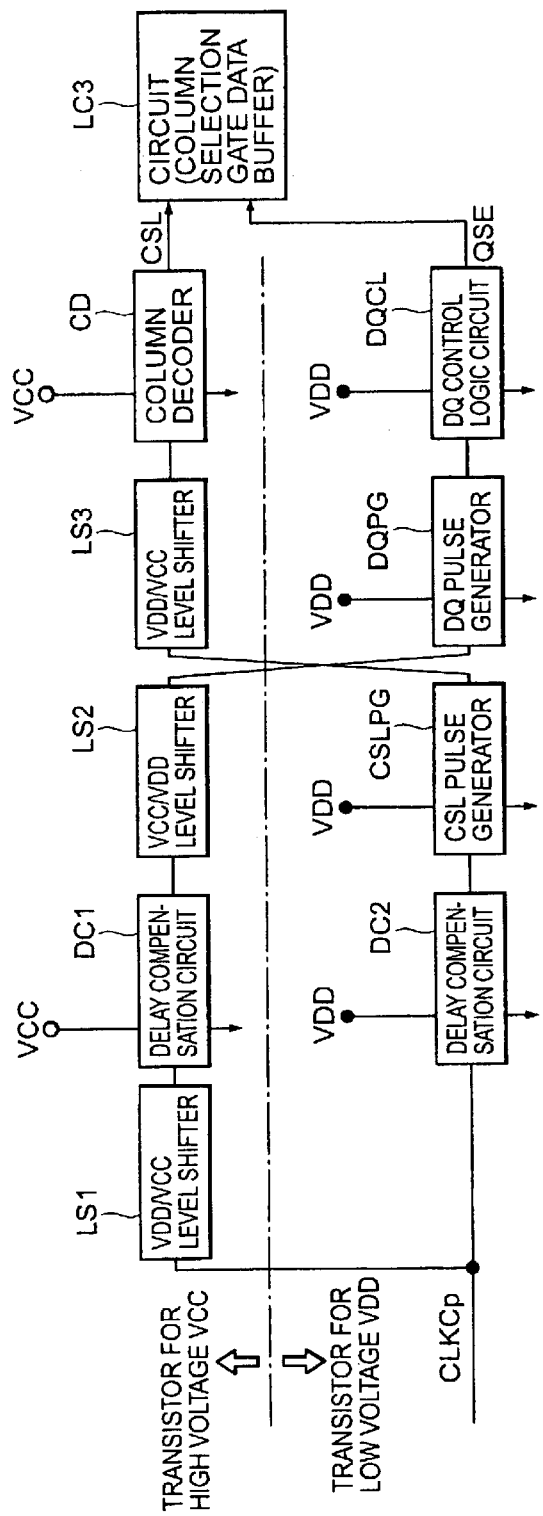
FIG. 2 is a block diagram showing the arrangement of a semiconductor storage device according to the second embodiment of the present invention.

A semiconductor storage device according to the second embodiment of the present invention will be described with reference to FIG. 2.

In this embodiment, the first embodiment is applied to a DRAM (Dynamic Random Access Memory). In this case, the logic circuit LC1 in the first embodiment corresponds to a column decoder CD, which generates and outputs a column selection signal CSL upon receiving a power supply voltage VCC and clock CLKCp. The logic circuit LC2 corresponds to a DQ control logic circuit DQCL, which generates and outputs a data buffer driving signal QSE upon receiving a power supply voltage VDD (VCC>VDD) and the clock CLKCp. The logic circuit LC3 corresponds to a circuit including a column selection gate and data buffer. Assume that the column decoder CD and DQ control logic circuit DQCL are respectively constituted by transistors having different characteristics, and can independently vary due to the manufacturing processes.

The column selection signal CSL output from the column decoder CD is a pulse-like signal for selecting a bit line connected to the output side of a memory cell (not shown) and connecting it to a data line for a predetermined period of time. This signal has the same voltage level as that of the power supply voltage VCC when it is at high level.

A delay compensation circuit DC2, CSL pulse generator CSLPG, and VDD/VCC level shifter LS3 are connected in series with the input side of the column decoder CD.

The data buffer driving signal QSE output from the DQ control logic circuit DQCL is a pulse-like signal for selectively driving a data buffer connected to a data line for a predetermined period of time. This signal has the same voltage level as that of the power supply voltage VDD when it is at high level.

A VDD/VCC level shifter LS1, delay compensation circuit DC1, VCC/VDD level shifter LS2, and DQ pulse generator DQPG are connected in series with the input side of the DQ control logic circuit DQCL.

The clock CLKCp is input to the VDD/VCC level shifter LS1. This clock CLKCp has the same level as that of the power supply voltage VDD when it is at high level. The voltage of the clock of high level is shifted to the same level as that of the power supply voltage VCC by the VDD/VCC level shifter LS1.

The delay compensation circuit DC1 receives the power supply voltage VCC and has a circuit arrangement which is electrically equivalent to the column decoder CD so as to have substantially the same delay characteristic as that of the column decoder CD. In addition, this circuit DC1 includes transistors having the same characteristics as those of the column decoder CD. Therefore, the clock CLKCp output from the delay compensation circuit DC1 is delayed upon receiving the influence of variations in the power supply voltage VCC or the influence of variations in the manufacturing process or the like as in the case with the transistors constituting the column decoder CD.

The VCC/VDD level shifter LS2 shifts the voltage of the clock CLKCp of high level output from the delay compensation circuit DC1 from the level of the power supply voltage VCC to the level of the power supply voltage VDD.

The DQ pulse generator DQPG receives the power supply voltage VDD and outputs a signal that goes to high level upon detection of the leading edge of the clock CLKCp output from the VCC/VDD level shifter LS2 and returns to low level after a lapse of a predetermined period of time shorter than the pulse width of the clock CLKCp. The use of this signal allows the DQ control logic circuit DQCL to operate accurately in synchronism with the leading edge of the clock CLKCp without being influenced by variations in the pulse width of the clock CLKCp.

An output from the DQ pulse generator DQPG is supplied to the DQ control logic circuit DQCL to output the data buffer driving signal QSE.

The delay compensation circuit DC2 operates upon receiving the clock CLKCp and power supply voltage VDD and has a circuit arrangement which is electrically equivalent to the DQ control logic circuit DQCL so as to have substantially the same delay characteristic as that of the DQ control logic circuit DQCL. In addition, this circuit DC2 includes transistors having the same characteristics as those of the DQ control logic circuit DQCL. Therefore, the clock CLKCp output from the delay compensation circuit DC2 is delayed upon receiving the influence of variations in the power supply voltage VDD or the influence of variations in the manufacturing process or the like as in the case with the transistors constituting the DQ control logic circuit DQCL.

The CSL pulse generator CSLPG receives the power supply voltage VDD and outputs a signal that goes to high level upon detection of the leading edge of the clock CLKCp output from the delay compensation circuit DC2 and returns to low level after a lapse of a predetermined period of time shorter than the pulse width of the clock CLKCp. The use of this signal allows the column decoder CD to operate accurately in synchronism with the leading edge of the clock CLKCp without being influenced by variations in the pulse width of the clock CLKCp.

The VDD/VCC level shifter LS3 shifts the voltage of the pulse of high level output from the CSL pulse generator CSLPG from the level of the power supply voltage VDD to the level of the power supply voltage VCC.

The column decoder CD generates and outputs the column selection signal CSL upon receiving the signal output from the VDD/VCC level shifter LS3.

According to this embodiment, stable circuit operation can be realized, and an electronic circuit is allowed to operate high speed by eliminating the delay mismatch between a plurality of logic circuits, which is caused when a plurality of externally input power supply voltages vary, and also eliminating any delay mismatch between the logic circuits constituted by transistors having different characteristics, which is caused when the characteristics of the respective transistors independently vary due to process variations and the like.

(3) Third Embodiment

Figure 3:
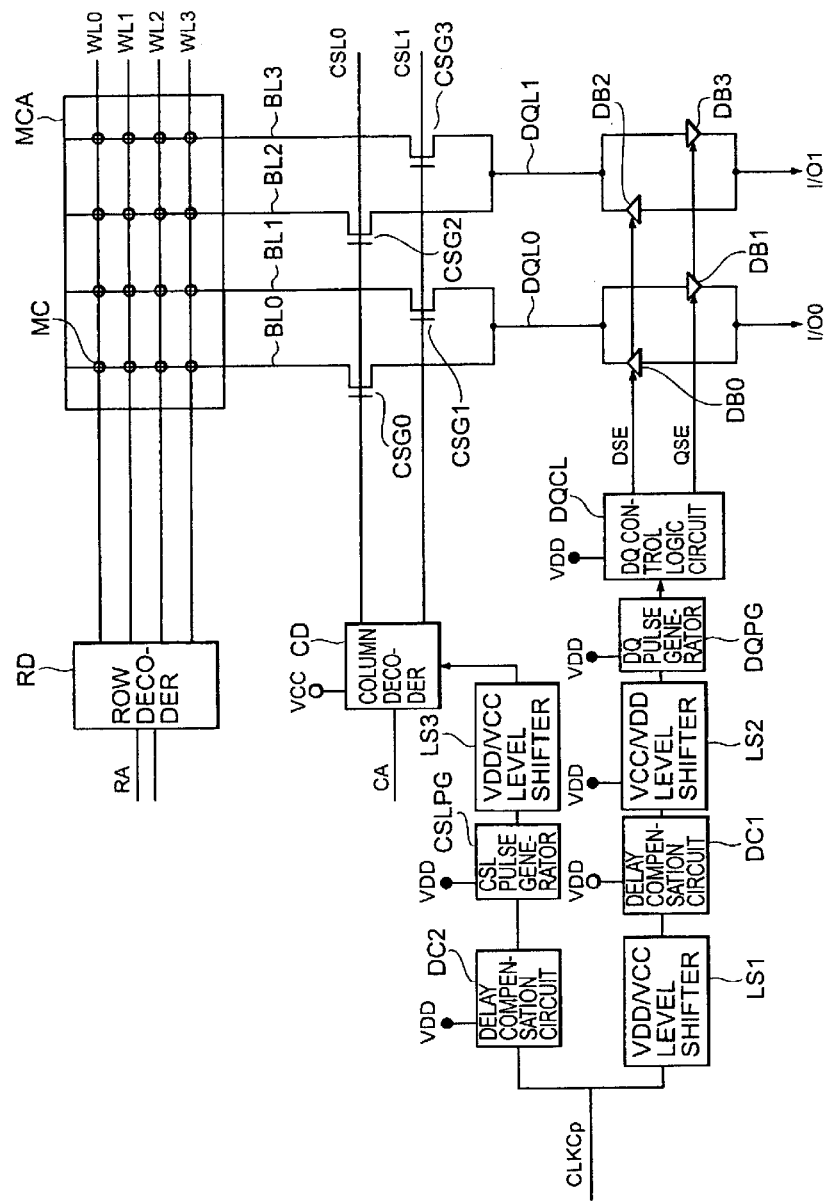
FIG. 3 is a block diagram showing the arrangement of a semiconductor storage device according to the third embodiment of the present invention.

In the third embodiment of the present invention, as shown in FIG. 3, specific circuits are connected to the output sides of the column decoder CD and DQ control logic circuit DQCL in the second embodiment.

A memory cell array MCA is formed such that memory cells MC are arranged at the intersections of word lines WL0 to WL3 and bit lines BL0 to BL3 which intersect at right angles.

One of the word lines WL0 to WL3 is selected by a row decoder RD which receives a row address RA and decodes it.

The bit lines BL0 to BL3 are respectively connected to the input sides of column selection gates CSG0 to CSG3. The output sides of the column selection gates CSG0 and CSG1 are connected to a data line DQL0, and the output sides of the column selection gates CSG2 and CSG3 are connected to a data line DQL1.

The data line DQL0 has a write data buffer DB0 and read data buffer DB1 inserted therein and is connected to an input/output line I/O0. The data line DQL1 has a write data buffer DB2 and read data buffer DB3 inserted therein and is connected to an input/output line I/O1.

The column selection gates CSG0 to CSG3 are selectively driven by a column selection signal CSL output from a column decoder CD to which a column address CA is input.

The output buffers DB0 to DB3 are selectively driven by a data buffer driving signal QSE output from the DQ control logic circuit DQCL.

Assume that the word line WL0 is enabled by the row decoder RD, the bit line BL0 is selected by the column decoder CD, and the data buffer DB0 is activated. In this case, external data input through the input/output line I/O0 is supplied/written to/in the memory cell MC connected to the intersection of the word line WL0 and the bit line BL0. If the data buffer DB1 is selected, the data read out from this memory cell MC is output to the outside through the input/output line I/O0.

According to this embodiment, both the column selection signal CSL output from the column decoder CD which operates upon receiving a power supply voltage VCC and a data buffer driving signal DQL output from the DQ control logic circuit DQCL which operates upon receiving a power supply voltage VDD are influenced by the influences of variations in the power supply voltages VCC and VDD, and also equally influenced by variations in the characteristics of the transistors constituting the column decoder CD and the characteristics of the transistors constituting the DQ control logic circuit DQCL due to the manufacturing processes and the like. If, therefore, these variations occur, the signals are delayed by substantially the same periods of time. This makes it possible to synchronize the operation timings of the column selection gates CSG0 to CSG3 with those of the data buffers DB0 to DB3 and hence prevent an operation error.

The functions and effects obtained by the second and third embodiments will be described in comparison with a semiconductor storage device associated with the present invention.

A case wherein the two output signals CSL and QSE in the semiconductor storage device associated with the present invention are independently delayed due to the influences of variations in the power supply voltages VCC and VDD or the influences of variations in the characteristics of the transistors constituting the column decoder CD and DQ control logic circuit DQCL will be described first with reference to FIGS. 4A to 4D showing the phases of the respective signals.

Figure 4A:
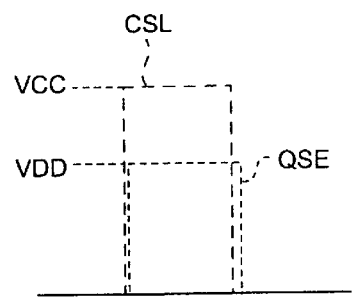
FIGS. 4A, 4B, 4C, and 4D are views for explaining the phase shifts caused by the delays of two signals in a semiconductor storage device associated with the present invention.

Basically, as indicated by the dotted lines in FIG. 4A, the column selection signal CSL and data buffer driving signal QSE have substantially the same phase although their levels differ from the power supply voltages VCC and VDD. This makes it possible to perform a data read and read without any trouble.

The column selection signal CSL, however, changes in phase depending on the power supply voltage VCC; as the voltage increases, the phase advances, and vice versa. Likewise, the data buffer driving signal QSE changes in phase depending on the power supply voltage VDD; as the voltage increases, the phase advances, and vice versa.

Figure 4C:
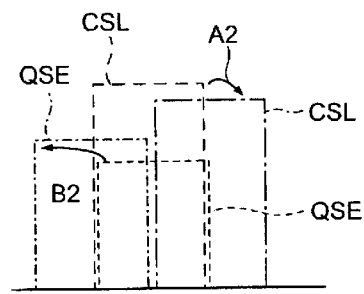
Figure 4B:
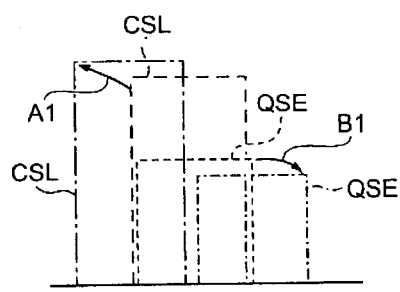

Referring to FIG. 4B, the chain lines respectively indicate changes in the phases of the signals CSL and QSE as the power supply voltage VCC increases and the power supply voltage VDD decreases. The phase of the column selection signal CSL shifts in the direction indicated by an arrow A1 in FIG. 4B (in which the phase advances). The phase of the data buffer driving signal QSE shifts in the direction indicated by an arrow B1 in FIG. 4B (in which the phase delays). As shown in FIG. 4B, in some case, no overlapping period exists between the two signals CSL and QSE, resulting in a trouble in write or read operation.

In contrast to this, referring to FIG. 4C, the chain lines respectively indicate changes in the phases of the signals CSL and QSE as the power supply voltage VCC varies downward and the power supply voltage VDD varies upward. The phase of the column selection signal CSL shifts in the direction indicated by an arrow A2 in FIG. 4C (in which the phase advances). The phase of the data buffer driving signal QSE shifts in the direction indicated by an arrow B2 in FIG. 4C (in which the phase delays). In this case as well, no overlapping period may exist between the two signals CSL and QSE, resulting in a trouble in write or read operation.

Figure 4D:
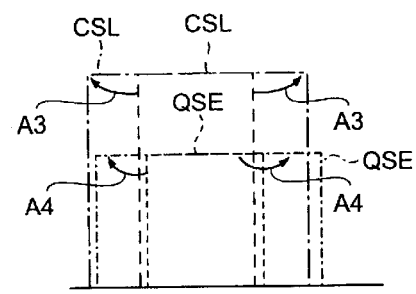

In order to ensure an overlapping period between the two signals CSL and QSE even in the presence of such phase shifts, the pulse width of the signals must be increased as indicated by the arrows in FIG. 4D in the device associated with the present invention. This will hinder high-speed operation of the DRAM.

Figure 5A:
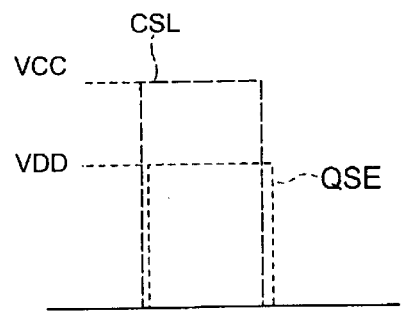
FIGS. 5A, 5B, and 5C are views showing signal delay characteristics in a semiconductor storage device according to the second or third embodiment.
Figure 5C:
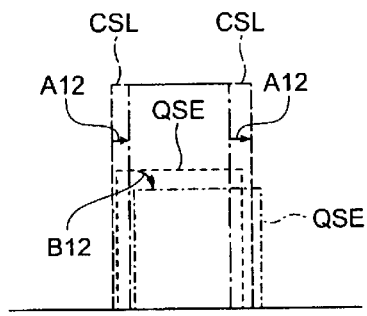
Figure 5B:
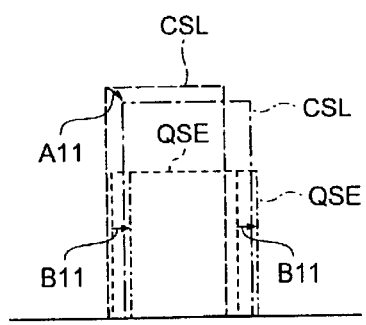

In contrast to this, FIGS. 5A to 5C show changes in the phases of the two signals CSL and QSE in the second and third embodiments. FIG. 5A shows the basic phases and voltages of the signals CSL and QSE.

FIG. 5B shows a case wherein the power supply voltage VCC drops in this state. The column selection signal CSL decreases in voltage, and delays in phase, as indicated by an arrow A11. The voltage level of the data buffer driving signal QSE remains the same as that of the power supply voltage VDD, but the phase delays as indicated by an arrow B11 like the column selection signal CSL. This is because the signal QSE depends on both the power supply voltages VCC and VDD and has the same characteristics. In contrast to this, when the power supply voltage VCC varies upward, the column selection signal CSL increases in voltage, and its phase advances. The voltage level of the data buffer driving signal QSE remains the same as that of the power supply voltage VDD, but its phase advances. In either of these cases, therefore, an overlapping period is ensured between the two signals CSL and QSE, and read/write operation can be done without any trouble.

FIG. 5C shows a case wherein the power supply voltage VDD drops. The data buffer driving signal QSE decreases in voltage, and delays in phase, as indicated by an arrow B12. The voltage level of the column selection signal CSL remains the same as that of the power supply voltage VCC, but the phase delays as indicated by an arrow A12 like the data buffer driving signal QSE. In contrast to this, when the power supply voltage VCC varies upward, the data buffer driving signal QSE increases in voltage, and its phase advances. The voltage level of the column selection signal CSL remains the same as that of the power supply voltage VCC, but its phase advances. Therefore, an overlapping period is ensured between the two signals CSL and QSE, and read/write operation can be done without any trouble.

As described above, according to the above embodiment, in an electronic circuit or semiconductor storage device to which different power supply voltages are externally applied, circuit operation can be stabilized, and the electronic circuit is allowed to operate at high speed by eliminating any delay mismatch caused in an internal circuit when the power supply voltage independently vary. Such an effect can be obtained by using transistors which depend on the two power supply voltages and have the same characteristics. In addition, in an electronic circuit or semiconductor storage device constituted by transistors having different characteristics, circuit operation can be stabilized and high-speed operation can be realized by eliminating any delay mismatch in the internal circuit which is caused when the respective transistor characteristics independently vary due to process variations and the like.

(4) Fourth Embodiment

Figure 6:
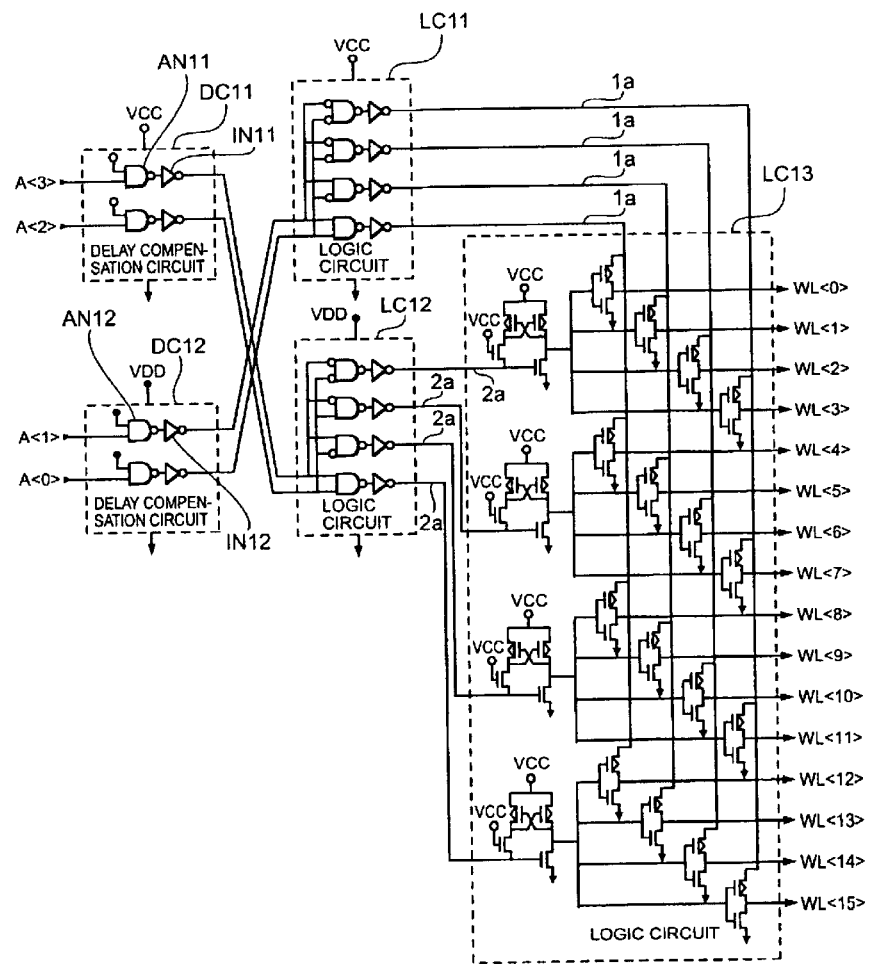
FIG. 6 is a circuit diagram showing the arrangement of a semiconductor storage device according to the fourth embodiment of the present invention.

FIG. 6 shows the arrangement of a semiconductor storage device according to the fourth embodiment of the present invention.

This embodiment exemplifies more specific arrangements of the logic circuits and delay compensation circuits.

Logic circuits LC11 and LC12 are binary decoding circuits, which output signals 1a and 1b. A logic circuit LC13 which receives these signals has an arrangement as an AND circuit. These logic circuits LC11 to LC13 constitute a binary decoder corresponding to a 4-bit address A<0> to A<3> as a whole.

A delay compensation circuit DC12 to which a power supply voltage VDD is applied and the address bits A<0> and A<1> are input is connected to the input side of the logic circuit LC11. A delay compensation circuit DC11 to which a power supply voltage VCC is applied and the address bits A<2> and A<3> are input is connected to the input side of the logic circuit LC12. Like the logic circuit LC11, the delay compensation circuit DC11 has a logic gate (AND circuit AN11 and inverter IN11) formed from a transistor which operates upon receiving the power supply voltage VCC. Like the logic circuit LC12, the delay compensation circuit DC12 has a logic gate (AND circuit AN12 and inverter IN12) formed from a transistor which operates upon receiving the power supply voltage VDD.

The delay compensation circuit DC11 has an arrangement electrically equivalent to that of the logic circuit LC11 so as to cause almost the same delay time as that caused by the logic circuit LC11. The delay compensation circuit DC12 has an arrangement electrically equivalent to that of the logic circuit LC12 so as to cause almost the same delay time as that caused by the logic circuit LC12. The delay compensation circuit DC11 and logic circuit LC11, and the delay compensation circuit DC12 and logic circuit LC12 logically differ from each other, but have the same delay characteristics.

The operation of this embodiment will be described. In this embodiment, the 2 address bits A<0> and A<1> are input to the logic circuit LC11 through the delay compensation circuit DC12, and the address bits A<2> and A<3> are input to the logic circuit LC12 through the delay compensation circuit DC11. The logic circuit LC13 then ANDs the input address bits to output a 16-bit signal: word line potentials WL<0> to WL<15>. With this operation, when a given combination of address bits A<0> to A<3> is input, one of the word line potentials WL is selectively set to logical value "1", and the remaining word line potentials WL are set to logical value "0".

FIG. 7A shows a change in the waveform of an address <0:3> in this embodiment; FIG. 7B, a change in the waveform of the signal 1a: A<0> and A<1>; FIG. 7C, a change in the waveform of a signal 2a: A<2> and A<3>; and FIGS. 7D to 7F, changes in the waveforms of word line potentials: WL<15>, WL<0>, and WL<3>.

First of all, consider that the address bits A<0:3> simultaneously change from logical value "0" to logical value "1" at time t1, and change from "1" to "0" after a lapse of a predetermined period of time, as shown in FIG. 7A.

The output signal 1a from the logic circuit LC11 changes from logical value "0" to logical value "1" at time t2 when a delay time τ1 has elapsed, as indicated by the waveform shown in FIG. 7B. Subsequently, this signal changes from "1" to "0". Likewise, an output signal from the logic circuit LC12 changes from logical value "0" to logical value "1" at time t2 when a delay time τ2 has elapsed, as indicated by the waveform shown in FIG. 7C.

A signal, e.g., the word line potential WL<15>, output from the logic circuit LC13 to which the output signals 1a and 2a are supplied changes from logical value "0" to logical value "1" at time t3 when a delay time τ3 has elapsed, as shown in FIG. 7D. Thereafter, this signal changes from "1" to "0". The signal WL<0> changes from logical value "1" to logical value "0" at time t3, as shown in FIG. 7E. Thereafter, this signal changes from "0" to "1". The word line potential WL<3> remains at logical value "0", as shown in FIG. 7F.

The waveforms of the input and output signals respectively shown in FIGS. 7A to 7F are, however, ideal waveforms; the delay time τ1 of the output signal 1a from the logic circuit LC11 is equal to the delay time τ2 of the output signal 2a from the logic circuit LC12, and hence no timing difference occurs. If, however, power supply voltages and transistor characteristics vary, a difference occurs between the delay times τ1 and τ2 in the device associated with the present invention, as described above.

Assume that when an address A<0:3> like that shown in FIG. 7A is input as shown in FIG. 8A, the output signal 1a from the logic circuit LC11 rises from time t2 with the delay time τ1 as indicated by the waveform shown in FIG. 8B as in the case shown in FIG. 7B.

Assume also that the output signal 2a: A<2> and A<3> from the logic circuit LC12 rises at time t2a with the delay time τ2 and a time Δτ2 as indicated by the waveform shown in FIG. 8C, unlike the waveform shown in FIG. 7C, owing to a downward variation in the power supply voltage VDD.

As a result, a mismatch occurs between the logic circuits LC11 and LC12 which should synchronize with each other. The word line potential WL<15> output from the logic circuit LC13 to which the two output signals 1a: A<0> and A<1> and 2a: A<2> and A<3> having a timing difference are input rises from logical value "0" to logical value "1" at time t4 delayed from time t3 as indicated by the waveform shown in FIG. 8D unlike the waveform shown in FIG. 7D. The duration of logical value "1" of this waveform is shorter than that of the ideal waveform.

When such a mismatch occurs, logical value "1" is erroneously output as indicated by the waveform shown in FIG. 8F in spite of the fact that logical value "0" must be maintained as indicated by the waveform of the word line potential WL<3> shown in FIG. 7F.

If the mismatch increases, an overlapping period disappears between the output signal 1a from the logic circuit LC11 and the output signal 2a from the logic circuit LC12, resulting in a phenomenon in which the waveform of the output signal: word line potential WL<15> from the logic circuit LC13 maintains logical value "0". In the circuit associated with the present invention, therefore, stable operation cannot be expected in a wide range of power supply voltages.

Figure 9A:
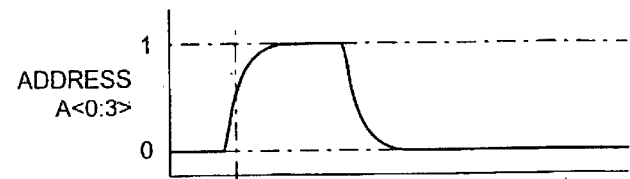
FIGS. 9A, 9B, 9C, 9D, 9E, and 9F are timing charts showing changes in the waveforms of signals in the semiconductor storage device according to the fourth embodiment.
Figure 9B:
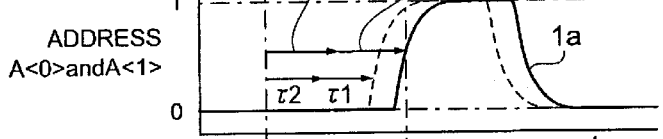
Figure 9C:
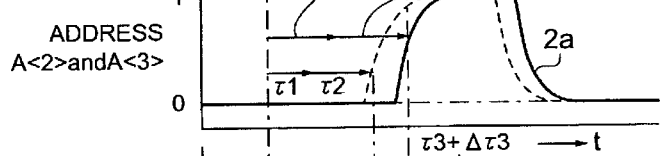

FIGS. 9A to 9F show operating waveforms in this embodiment designed to solve this problem. As shown in FIG. 9A, when the address A<0:3> like the one shown in FIG. 7A is input, the output signal 1a: A<0> and A<1> from the logic circuit LC11 rises upon being delayed by variations in the power supply voltages VCC and VDD and transistor characteristics like a waveform 1b shown in FIG. 9B.

Likewise, the output signal 2a: A<2> and A<3> from the logic circuit LC12 rises upon being delayed by variations in the power supply voltages VCC and VDD and the characteristics of transistors like the waveform shown in FIG. 9B.

Figure 9D:
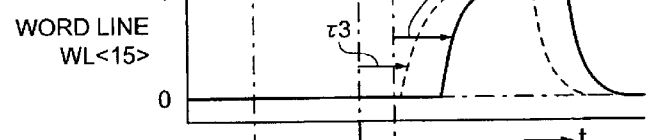
Figure 9E:
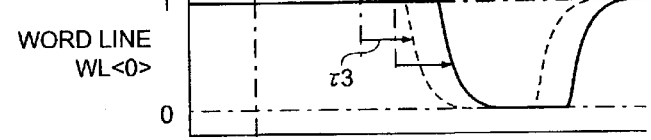
Figure 9F:
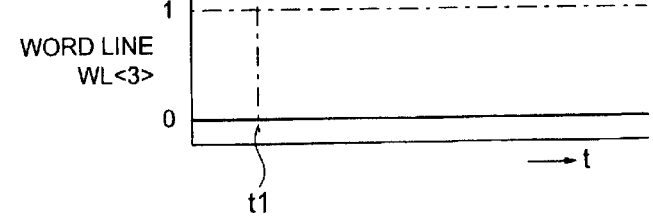

As shown in FIGS. 9D and 9E, the output signals: word line potential WL<15> and WL<0> from the logic circuit LC13 change due to variations in the power supply voltages VCC and VDD and the characteristics of transistors.

The delay times in this case will be described by using simple mathematical expressions. The standard delay time in the logic circuit LC11 in the absence of variations in power supply voltage and transistor characteristics is represented by τ1, and the delay time caused by variations in the power supply voltage VCC and the characteristics of a high-voltage transistor is represented by Δτ1. Likewise, the standard delay time in the logic circuit LC12 in the absence of variations in power supply voltage and transistor characteristics is represented by τ2, and the delay time caused by variations in the power supply voltage VDD and the characteristics of a high-voltage transistor is represented by Δτ2.

In this case, the delay time in the logic circuit LC11 is given by τ1+Δτ1, and the delay time in the delay compensation circuit DC11 having a delay characteristic equivalent to that of the logic circuit LC11 is also given by τ1+Δτ1. The delay time in the logic circuit LC12 is given by τ2+Δτ2, and the delay time in the delay compensation circuit DC12 having a delay characteristic equivalent to that of the logic circuit LC12 is also given by τ2+Δτ2.

At this time, the time between the instant at which the logical value of the 2-bit address A<0:1> changes and the instant at which the logical value of an output signal from the logic circuit LC11 changes can be expressed by (τ2+Δτ2)+(τ1+Δτ1). Likewise, the time between the instant at which the logical value of the 2-bit address A<2:3> changes and the instant at which the logical value of an output signal from the logic circuit LC12 changes can be expressed by (τ1+Δτ1)+(τ2+Δτ2).

As indicated by these mathematical expressions, the delay time of the output signal 1a from the logic circuit LC11 becomes equal to the delay time of the output signal 2a from the logic circuit LC12 when one of the power supply voltages VCC and VDD varies and/or the characteristics of one of a high-voltage transistor and low-voltage transistor varies.

In addition, letting τ3 be the standard delay time in the logic circuit LC13 in the absence of variations in power supply voltages and transistor characteristics, and Δτ3 be the delay time caused by variations in the power supply voltage (power supply voltage VCC in this embodiment) applied to the logic circuit LC13 or variations in the characteristics of a high-voltage transistor, the delay time of the output signal: word line potential WL<0:15> from the logic circuit LC13 is given by τ1+τ2+τ3 in the absence of variations, and by Δτ1+Δτ2+Δτ3 in the presence of variations.

The delay times of an output from the logic circuit LC13 with and without variations become larger than those before the delay compensation circuits DC11 and DC12 are inserted. However, the demerit caused by this arrangement is smaller than that caused when the overall circuit is constituted by high- or low-voltage transistors.

As described above, according to this embodiment, even if a mismatch is caused between the delay time in the logic circuit LC11 and the delay time in the logic circuit LC12 due to variations in power supply voltage or transistor characteristics, the mismatch is eliminated by the functions of the delay compensation circuits DC12 and DC11 arranged on the respective input sides, thereby preventing the waveform of an output signal from the logic circuit LC13 from being narrowing or disappearing. In addition, this prevents a phenomenon in which an output signal that should be maintained at logical value "0" changes to logical value "1".

(5) Fifth Embodiment

The fifth embodiment of the present invention will be described with reference to FIG. 10 which shows its arrangement.

In this embodiment, when a low-voltage signal line is connected to a high-voltage circuit in the fourth embodiment, a VDD/VCC level shifter is inserted between the signal line and the circuit. Nowadays, 2.5 V and 1.5 V are generally used as a high power supply voltage VCC and low power supply voltage VDD, respectively. In this case, when a signal line that is driven at 1.5 V is connected to a 2.5 V driven CMOS circuit, the P-channel transistor is not completely turned off, and hence a current keeps on flowing. In order to prevent such a situation, a VDD/VCC level shifter for boosting/converting the signal line potential to 2.5 V is required.

In many cases, however, a level shifter is a circuit which uses a current drivability ratio between the P-channel transistor and the N-channel transistor. With this arrangement, the delay time is greatly influenced by variations in the high power supply voltage VCC and low power supply voltage VDD.

Figure 10:
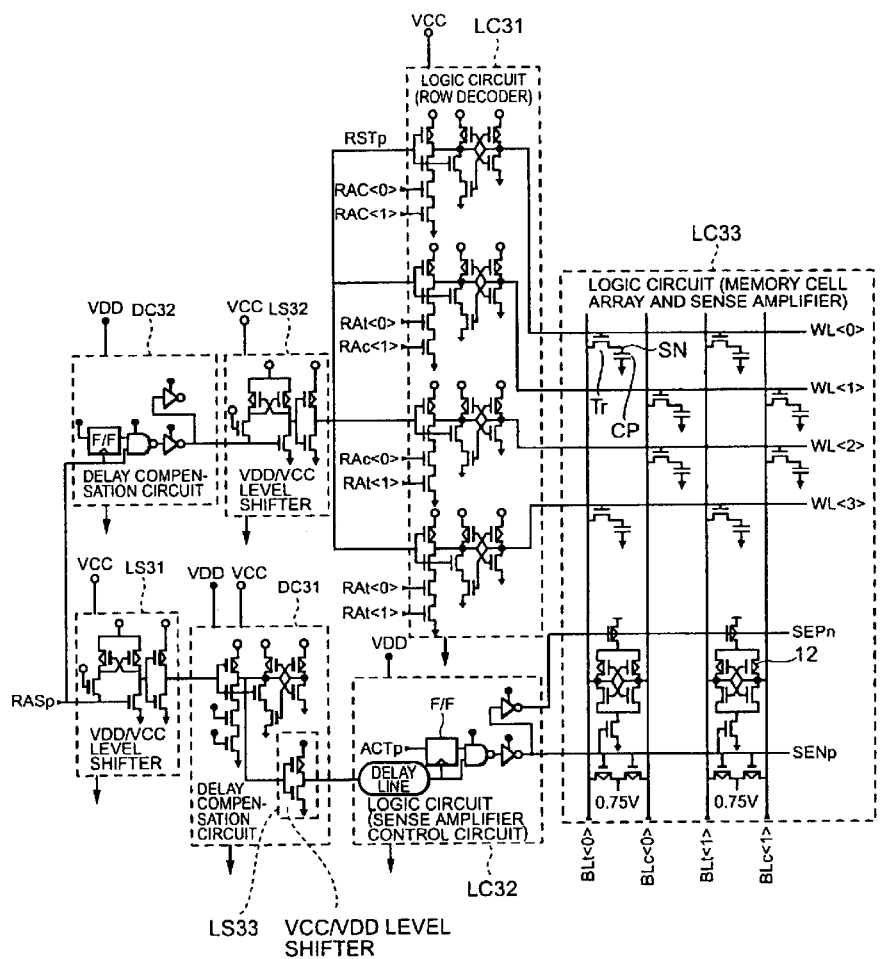
FIG. 10 is a circuit diagram showing the arrangement of a semiconductor storage device according to the fifth embodiment of the present invention.

In this embodiment, therefore, as shown in FIG. 10, a level shifter LS12 is connected to the input side of a logic circuit LC11 to which the high power supply voltage VCC is applied, and a level shifter LS11 is connected to the input side of a delay compensation circuit DC11 connected to the input side of a logic circuit LC12. In this case, since the two level shifters LS11 and LS12 have equivalent circuit arrangements, equal delay times are always caused with respect to variations in the power supply voltage VCC and the characteristics of transistors. Even if, therefore, these level shifters LS11 and LS12 are connected to the input sides of the logic circuits LC12 and LC11, there is no possibility that a delay time mismatch will occur.

(6) Sixth Embodiment

Figure 11:
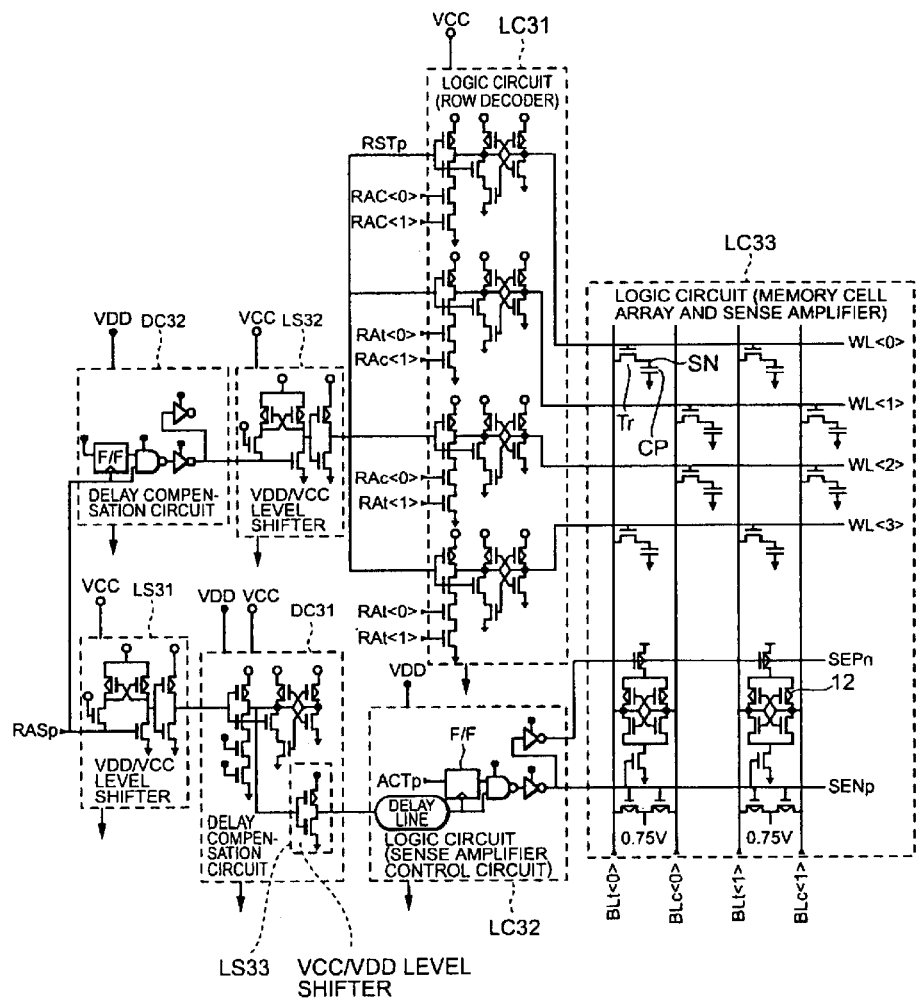
FIG. 11 is a circuit diagram showing the arrangement of a semiconductor storage device according to the sixth embodiment of the present invention.

A semiconductor storage device according to the sixth embodiment of the present invention will be described with reference to FIG. 11. In this embodiment, the present invention is applied to a DRAM. Of three logic circuits LC31 to LC33, the logic circuit LC31 corresponds to a row decoder; the logic circuit LC32, a sense amplifier control circuit; and the logic circuit LC33, a memory cell array and sense amplifier.

As in the fifth embodiment, a delay compensation circuit DC32 and VDD/VCC level shifter LS 32 are connected in series with the input side of the logic circuit LC31, and a VDD/VCC level shifter LS31 and delay compensation circuit DC31 are connected in series with the input side of the logic circuit LC32.

In this case, the delay compensation circuit DC31 has an arrangement having a delay characteristic equivalent to that of the logic circuit LC31, and the delay compensation circuit DC32 has an arrangement having a delay characteristic equivalent to that of the logic circuit LC32. The VDD/VCC level shifters LS31 and LS32 have the same circuit arrangement. A portion of the delay compensation circuit DC31 includes a VCC/VDD level shifter LS33.

One DRAM cell included in the logic circuit LC33 is constituted by one N-channel transistor Tr and one capacitor CP. A storage node SN connected to one end of the capacitor CP is connected to a bit line BL through the N-channel transistor Tr. In this arrangement, in order to transmit a high-level signal through the bit line BL, the gate potential must be set to be higher than the source potential by at least a threshold voltage Vth of the N-channel transistor Tr.

According to a recent technique, for example, the high level of the bit line BL is set to 1.5 V, and the high level of a wordline WL is set to 3.0 V. In this case, each low-voltage transistor constituting the logic circuit is optimized at a low voltage of 1.5 V. The gate oxide film thickness and channel length are reduced to 3 nm and 100 nm, respectively. The signal transmission delay of the CMOS gate having this arrangement is decreased to about 30 psec.

On the other hand, the N-channel transistors Tr constituting the DRAM cell array and the transistors constituting the logic circuit LC1 (row decoder) are high-voltage transistors which are optimized at a high voltage of 3.0 V. In this case, the gate oxide film thickness and channel length are about 6 nm and 200 nm, respectively.

Figure 13:
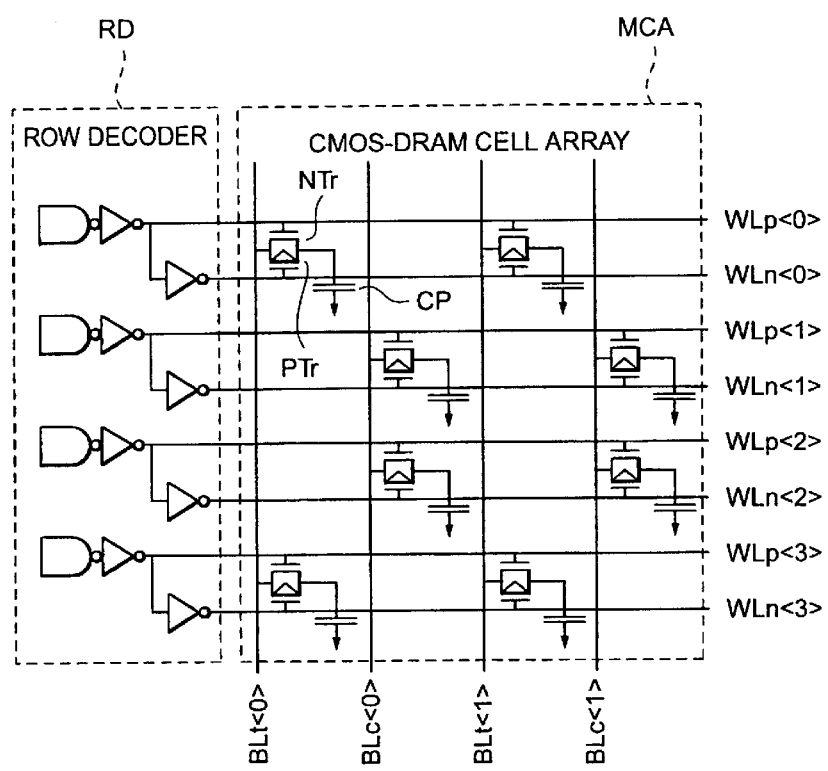
FIG. 13 is a circuit diagram showing the arrangement of a CMOS-DRAM cell array constituted by low-voltage transistors.

Assume that a DRAM is constituted by only low-voltage transistors. In this case, a row decoder RD and memory cell array MCA have arrangements like those shown in FIG. 13. An N-channel transistor NTr, P-channel transistor PTr, and capacitor CP need to be used for one memory cell. As a consequence, a pair of positive and negative logic word lines WLn and Wlp must be arranged, resulting in a great increase in the area of the memory cell array. The circuit according to this embodiment, which can have a simple arrangement, allows an increase in integration degree, although part of the circuit uses high-voltage transistors which are disadvantageous in terms of miniaturization.

Figure 12A:
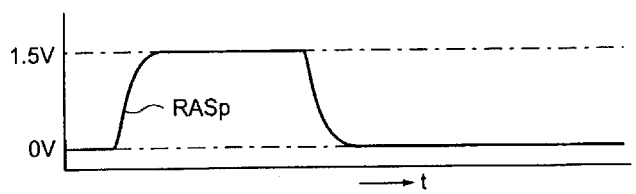
FIGS. 12A, 12B, and 12C are timing charts showing changes in the waveforms of signals in the semiconductor storage device according to the sixth embodiment.
Figure 12B:
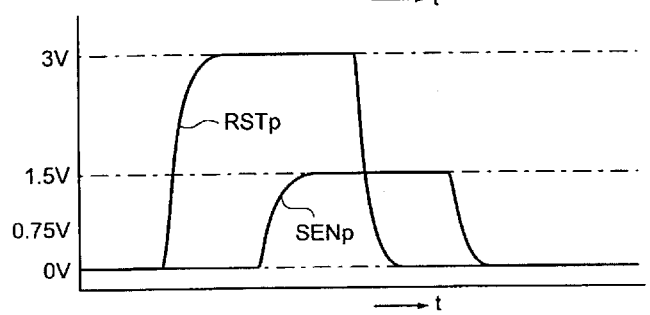
Figure 12C:
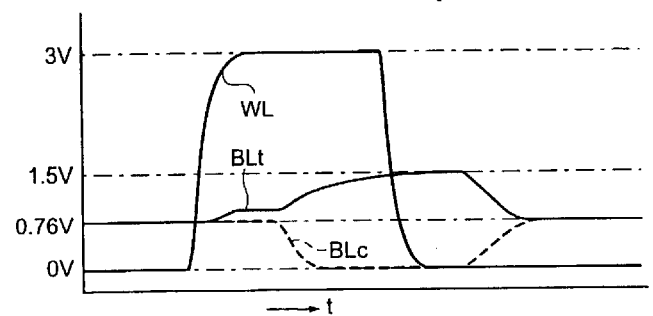

The operation timing of this embodiment will be described next. FIGS. 12A to 12C show the operating waveforms of the respective signals in this embodiment. In each memory cell and sense amplifier in the logic circuit LC33, high-voltage signal lines (word lines WL <0:3> must be connected to low-voltage signal lines (sense amplifier control lines SEPn and SENp), and hence matching between the operation timings of these lines must be ensured.

The timings of the logic circuits LC31, LC32, and LC33 are synchronized with each other in synchronism with a timing signal RASp having the waveform shown in FIG. 12A.

When the timing signal RASp is set at high level, a row decoder control signal RSTp shown in FIG. 12B is generated and supplied to the logic circuit LC31 through the delay compensation circuit DC32 and VDD/VCC level shifter LS32.

One of the four word lines WL is set at high level in accordance with the levels of row addresses RAt<0>, RAc<0>, RAt<1>, and RAc<1> input to the logic circuit LC31, as shown in FIG. 12C. In this case, the voltage of the word line WL rises up to 3.0 V, as described above.

When one of the word lines WL is set at high level, the storage node SN of the memory cell is electrically connected to the bit line BL, and a small potential difference is produced between a pair of bit lines BLt and BLc in accordance with the amount of charge stored in the memory cell.

Sense amplifier control signals SENp and SEPn output from the logic circuit LC32 are then set at high level, as shown in FIG. 12B, thereby activating the sense amplifier included in the logic circuit LC33. The potential difference between pair of bit lines BL5 and BLc is amplified to finally become 1.5 V.

Subsequently, the word line control line RSTP returns to low level as shown in FIG. 12B and the potential of the word line WL, which has risen, returns to low level as shown in FIG. 12C in synchronism with the timing when the timing signal RASp is set at low level as shown in FIG. 12A. When the sense amplifier control signal SENp returns to low level, the sense amplifier is inactivated, and the pair of bit lines BLt and BLc are precharged to 0.75V for the next sensing operation.

It is very important for memory read/write operation to control the timing of a series of operations described above. If, for example, the time interval between the instant at which the word line WL is set at high level and the instant at which the sense amplifier control signal SENP is set at high level is excessively short, the potential difference between the pair of bit lines BLt and BLc becomes too small to perform a read.

In contrast to this, if the above time interval is excessively long, there-store (data write-back) time shortens, and the bit line BLt cannot reach 1.5 V, resulting in a data loss error.

According to this embodiment, even if the high voltage supply VCC and low voltage supply VDD independently vary or a high-voltage transistor or low-voltage transistor independently varies in characteristic, the above timing can be optimally controlled, and high-speed operation can be realized without causing any operation error.

(7) Seventh Embodiment

Figure 14:
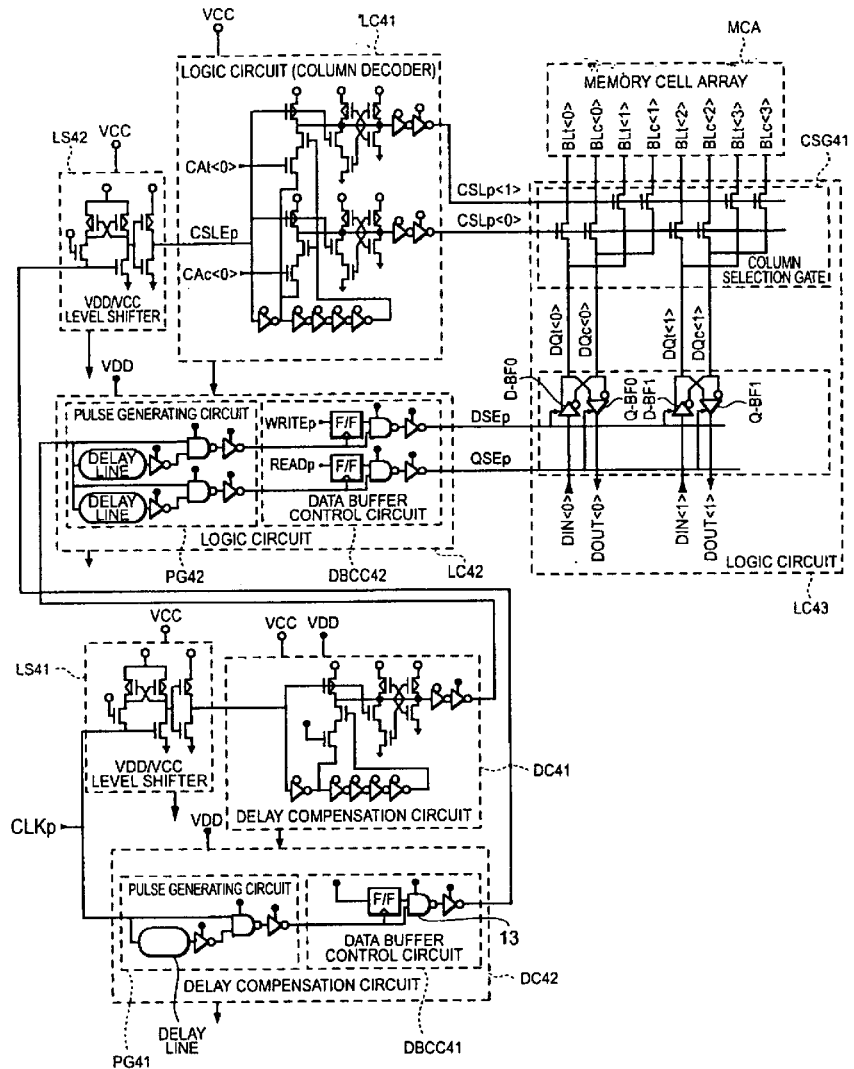
FIG. 14 is a circuit diagram showing the arrangement of a semiconductor storage device according to the seventh embodiment of the present invention.

The seventh embodiment of the present invention will be described with reference to FIG. 14 showing the arrangement of the embodiment.

In this embodiment, the present invention is applied to control of a column selection gate CSG41 and data buffers (write data buffer D-BF and read data buffer Q-BF) in a semiconductor storage device according to the present invention.

In this case, a logic circuit LC41 corresponds to a column decoder; a logic circuit LC42, a pulse generating circuit PG42 and data buffer control circuit DBCC42; and a logic circuit LC43, the column selection gate CSG41 and data buffers D-BF and Q-BF.

The connection relationship between these circuits is the same as that in the sixth embodiment. That is, a timing signal CLKp is supplied to the logic circuit LC41 through a delay compensation circuit DC42 and VDD/VCC level shifter LS42, the timing signal CLKp is supplied to the logic circuit LC42 through a VDD/VCC level shifter LS41 and delay compensation circuit DC41, and data buffer driving signals DSEp and QSEp output from the logic circuit LC42 are input to a logic circuit LC43.

The delay compensation circuit DC41 has an arrangement electrically equivalent to that of the logic circuit LC41 so as to have a similar delay characteristic. The delay compensation circuit DC42 has an arrangement electrically equivalent to that of the logic circuit LC42 so as to have a similar delay characteristic. The VDD/VCC level shifters LS41 and LS42 have the same circuit arrangement.

A recent DRAM is required to operate at high speed such that a column can be accessed at 200 MHz or more. At the same time, a higher integration degree is required to attain a reduction in cost as much as possible. The most important factors in satisfying these two requirements are the arrangement of a column selection gate and a control method therefor.

One column selection gate CSG41 is formed for each bit line BL1 in a sense amplifier area. One column selection line CSLp is selected in accordance with a column address CA input to the logic circuit (column decoder) LC41, and the column selection gate CSG41 connected to the selected line electrically connects a corresponding pair of bit lines BLt and BLc and a corresponding pair of data lines DQt and DQc.

For example, in a recent 16-Mbit embedded DRAM, the number of bit lines for 128 data lines reaches as many as 65,000. In order to achieve an increase in integration degree, a column selection gate is required to have a simple arrangement. One of such arrangements uses an N-channel transistor as a switching element.

In this arrangement, however, as in the case with the DRAM cell constituted by one transistor and one capacitor which is described in the sixth embodiment, the voltage of the column selection line CSLp needs to be higher than the threshold Vth of the transistor of the memory cell. Consequently, the column selection line CSLp is a high-voltage line.

The write data buffers D-BF and read data buffers Q-BF for driving the 128 data lines are preferably formed from low-voltage transistors each using a low power supply voltage in order to realize high-speed operation.

This makes it necessary to match the driving timing of the column selection line CSL as a high-voltage line with the driving timings of the data buffer driving lines DSEp and QSEp as low-voltage lines.

Figure 15A:
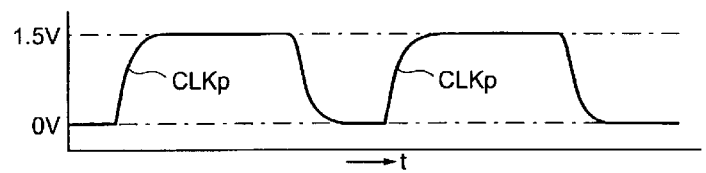
FIGS. 15A, 15B, and 15C are timing charts showing changes in the waveforms of signals in the semiconductor storage device according to the seventh embodiment.
Figure 15B:
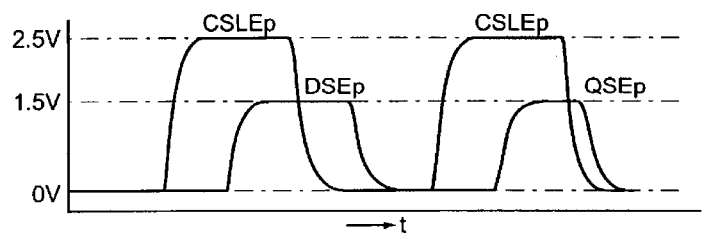
Figure 15C:
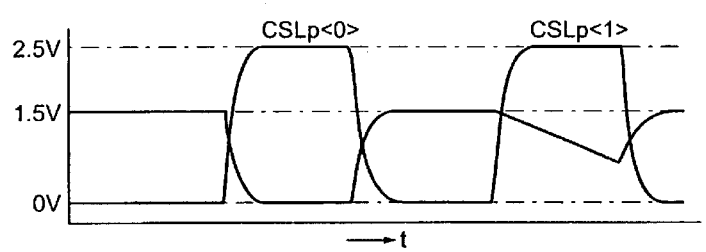

The operation of this embodiment will be described below with reference to FIGS. 15A to 15C showing operating waveforms in this case. This DRAM operates in synchronism with the timing signal CLKp having the waveform shown in FIG. 15A. When the timing signal CLKp is set at high level, the column decoder control signal CSLEp shown in FIG. 15C is generated and input to the logic circuit LC41 (column decoder) through the delay compensation circuit DC42 and level shifter LS42.

One column selection signal line CSLp is set at high level in synchronism with this signal CSLEp in accordance with column addresses CAt<0>, CAc<0>, CAt<1>, and CAc<1>, as shown in FIG. 15C. In this case, the column selection signal line CSLp reaches a high potential of 2.5 V, as described above.

When the column selection signal line CSLp is set at high level, the pair of bit lines BLt and BLc are electrically connected to the pair of data lines DQt and DQc.

At the same time, the data buffer driving signal DSEp or QSEp which is output from the logic circuit LC42 and activates the write data buffer D-BF or read data buffer Q-BF is set at high level. At present, this operation can be completed in 1 to 2 ns. If the DRAM is left standing in this state, an extra short-circuit current may be produced. The pulse generating circuit PG42 included in the logic circuit LC42 therefore controls the timing at which the column selection line CSL is inactivated in a self-aligning manner and, at the same time, the timing at which the write data buffer D-BF and read data buffer Q-BF are inactivated.

As in the sixth embodiment, in this embodiment, it is very important to control the timing of the series of operations described above. In order to attain an increase in operation speed, the pulse width must be decreased. For example, in order to realize an operation speed of 200 MHz, the set value of pulse width must be 2 ns or less in consideration of variations and fluctuations in the characteristics of elements.

On the other hand, an excessively short pulse width will cause an operation error. In read operation, when the read data buffer Q-BF is operated before a sufficient potential is generated at a data line, a read error occurs. In write operation, the magnitude relationship in potential between the pair of bit lines BLt and BLc cannot be reversed, and hence a write error occurs. Such operation errors may becaused by a timing mismatch between the column selection signal line CSLp and data buffer driving signals QSEp and DSEp as well as an excessively short pulse width.

In contrast to this, according to this embodiment, a timing matching between the column selection signal CSLp output from the logic circuit LC41 and the data buffer driving signals QSEp and DSEp output from the logic circuit LC42 can be ensured even if the two power supply voltages VCC and VDD independently vary or the characteristics of the high- and low-voltage transistors constituting the two circuits independently vary. This makes it possible to realize stable circuit operation without requiring any extra margins of pulse width, delay time, and the like.

All the above embodiment are examples and do not limit the present invention. For example, the second to seventh embodiments exemplify DRAMS. However, the present invention is not limited to DRAMS, and can be widely applied to devices each of which operates upon receiving a plurality of power supply voltages and has two circuits whose operations must be synchronized with each other.

What is claimed is:

1. An electronic circuit comprising:
   a first delay compensation circuit which receives a first power supply voltage and a first signal and outputs a first output signal delayed by a first predetermined time;
   a second delay compensation circuit which receives a second power supply voltage and the first signal and outputs a second output signal delayed by a second predetermined time;
   a first logic circuit which receives the first power supply voltage and the second output signal output from said second delay compensation circuit and outputs a first operation result by performing first logic operation; and
   a second logic circuit which receives the second power supply voltage and the first output signal output from said first delay compensation circuit and outputs a second operation result by performing second logic operation.

2. A circuit according to claim 1, wherein
   the first power supply voltage is higher than the second power supply voltage,
   the first input signal has the same level as that of the second power supply voltage of high level, and
   said circuit further comprises
      a first boosting circuit which receives the first input signal and boosts the second power supply voltage of high level to the first power supply voltage and applies the voltage to said first delay compensation circuit, and
      a second boosting circuit which receives the second output signal output from said second delay compensation circuit and having the same level as that of the second power supply voltage of high level, boosts the second power supply voltage of high level to the first power supply voltage, and applies the voltage to said first logic circuit.

3. A circuit according to claim 1, wherein
   said first delay compensation circuit receives an N-bit address and has first operation elements corresponding to N (N is an integer not less than one) bits each of which receives one address bit of the address and the first power supply voltage to calculate and output an AND thereof,
   said second delay compensation circuit receives an N-bit address and has first operation elements corresponding to N (N is an integer not less than one) bits each of which receives one address bit of the address and the second power supply voltage to calculate and output an AND thereof,
   said first logic circuit has third operation elements corresponding to N bits each of which receives two inverted or non-inverted signals of an N-bit signal output from said second delay compensation circuit to calculate and output an AND thereof, and
   said second logic circuit has fourth operation elements corresponding to N bits each of which receives two inverted or non-inverted signals of an N-bit signal output from said first delay compensation circuit to calculate and output an AND thereof.

4. A circuit according to claim 1, wherein
   said first delay compensation circuit has a circuit arrangement which is electrically equivalent to said first logic circuit and causes substantially the same signal delay as that caused by said first logic circuit, and
   said second delay compensation circuit has a circuit arrangement which is electrically equivalent to said second logic circuit and causes substantially the same signal delay as that caused by said second logic circuit.

5. A circuit according to claim 1, wherein the first signal is a timing signal for synchronizing the first logic operation of said first logical circuit with the second logic operation of said second logic circuit.

6. An electronic circuit comprising:
   a first delay compensation circuit which receives a first power supply voltage, includes a transistor having a first characteristic, receives a first signal, and outputs a first output signal delayed by a first predetermined time;

a second delay compensation circuit which receives a second power supply voltage, includes a transistor having a second characteristic, receives a second signal, and outputs a second output signal delayed by a second predetermined time;

a first logic circuit which receives the first power supply voltage and the second output signal output from said second delay compensation circuit, performs first logic operation, and outputs a first operation result; and a second logic circuit which receives the first power supply voltage and the first output signal output from said first delay compensation circuit, performs second logic operation, and outputs a second operation result.

7. A circuit according to claim 6, wherein the first power supply voltage is higher than the second power supply voltage, the first input signal has the same level as that of the second power supply voltage of high level, and said circuit further comprises a first boosting circuit which receives the first input signal, boosts the second power supply voltage of high level to the first power supply voltage, and applies the voltage to said first delay compensation circuit, and a second boosting circuit which receives the second output signal output from said second delay compensation circuit and having the same level as that of the second power supply voltage of high level, boosts the second power supply voltage of high level to the first power supply voltage, and applies the voltage to said first logic circuit.

8. A circuit according to claim 6, wherein said first delay compensation circuit receives an N-bit address and has first operation elements corresponding to N (N is an integer not less than one) bits each of which receives one address bit of the address and the first power supply voltage to calculate and output an AND thereof, said second delay compensation circuit receives an N-bit address and has first operation elements corresponding to N (N is an integer not less than one) bits each of which receives one address bit of the address and the second power supply voltage to calculate and output an AND thereof, said first logic circuit has third operation elements corresponding to N bits each of which receives two inverted or non-inverted signals of an N-bit signal output from said second delay compensation circuit to calculate and output an AND thereof, and said second logic circuit has fourth operation elements corresponding to N bits each of which receives two inverted or non-inverted signals of an N-bit signal output from said first delay compensation circuit to calculate and output an AND thereof.

9. A circuit according to claim 6, wherein said first delay compensation circuit has a circuit arrangement which is electrically equivalent to said first logic circuit and causes substantially the same signal delay as that caused by said first logic circuit, and said second delay compensation circuit has a circuit arrangement which is electrically equivalent to said second logic circuit and causes substantially the same signal delay as that caused by said second logic circuit.

10. A circuit according to claim 6, wherein the first signal is a timing signal for synchronizing the first logic operation of said first logical circuit with the second logic operation of said second logic circuit.

11. An electronic circuit comprising:

a first level shifter which receives a first signal that has a second voltage at high level, boosts the second voltage to a first voltage, and outputs the first signal;

a first delay compensation circuit which receives a first power supply voltage having the first voltage and the first signal output from said first level shifter and outputs a first output signal delayed by a first predetermined time;

a second level shifter which receives the first output signal that has the first voltage at high level and output from said first delay compensation circuit, boosts the first voltage to the second voltage, and outputs the first output signal;

a second delay compensation circuit which receives the second power supply voltage and the first signal that has the second voltage at high level and outputs a second output signal delayed by a second predetermined time;

a third level shifter which receives the second output signal output from said second delay compensation circuit and boosts the second voltage of the second output signal of high level to the first voltage;

a first logic circuit which receives the first power supply voltage and the second output signal output from said third level shifter, performs first logic operation, and outputs a first operation result; and a second logic circuit which receives the second power supply voltage having the second voltage and the first output signal output from said second level shifter, performs second logic operation, and outputs a second operation result.

12. A circuit according to claim 11, wherein said first delay compensation circuit receives an N-bit address and has first operation elements corresponding to N (N is an integer not less than one) bits each of which receives one address bit of the address and the first power supply voltage to calculate and output an AND thereof, said second delay compensation circuit receives an N-bit address and has first operation elements corresponding to N (N is an integer not less than one) bits each of which receives one address bit of the address and the second power supply voltage to calculate and output an AND thereof, said first logic circuit has third operation elements corresponding to N bits each of which receives two inverted or non-inverted signals of an N-bit signal output from said second delay compensation circuit to calculate and output an AND thereof, and said second logic circuit has fourth operation elements corresponding to N bits each of which receives two inverted or non-inverted signals of an N-bit signal output from said first delay compensation circuit to calculate and output an AND thereof.

13. A circuit according to claim 11, wherein said first delay compensation circuit has a circuit arrangement which is electrically equivalent to said first logic circuit and causes substantially the same signal delay as that caused by said first logic circuit, and said second delay compensation circuit has a circuit arrangement which is electrically equivalent to said second logic circuit and causes substantially the same signal delay as that caused by said second logic circuit.

14. A circuit according to claim 11, where in the first signal is a timing signal for synchronizing the first logic operation of said first logical circuit with the second logic operation of said second logic circuit.

15. A semiconductor storage device comprising:

a memory cell array having a plurality of memory cells connected to a plurality of bit lines;

column selection gates each provided for a corresponding one of the bit lines to select the bit line;

a column decoder which generates a column selection signal for selectively driving said column selection gates;

data buffers each of which is provided for a corresponding one of said column selection gates, receives data output from said corresponding column selection gate, and amplifies and outputs the data;

a data buffer control logic circuit which generates a data buffer driving signal for selectively driving said data buffers;

a first delay compensation circuit which receives a first power supply voltage and a timing signal and outputs a first output signal delayed by a first predetermined time to said data buffer control logic circuit; and a second delay compensation circuit which receives a second power supply voltage and the timing signal and outputs a second output signal delayed by a second predetermined time to said column decoder.

16. A device according to claim 15, wherein said column decoder is configured to receive a column address and generate the column selection signal by decoding in accordance with the timing signal, said first delay compensation circuit is configured to receive the first power supply voltage in place of the column address, perform decoding in accordance with the timing signal, and output a result to said data buffer control logic circuit;

said data buffer control logic circuit includes a first latch circuit which receives an output control signal, holds the signal, and outputs the signal, and a first operation element which receives the output control signal output from said first latch circuit and the timing signal, calculates an AND thereof, and outputs the data buffer driving signal; and said second delay compensation circuit includes a second latch circuit which receives the second power supply voltage in place of the output control signal, holds the voltage, and outputs the voltage, and a second operation element which receives the second power supply voltage output from said second latch circuit and the timing signal, calculates an AND thereof, and outputs the AND to a second operation element.

17. A device according to claim 15, wherein said first delay compensation circuit has a circuit arrangement which is electrically equivalent to said column decoder and causes substantially the same signal delay as that caused by said column decoder, and said second delay compensation circuit has a circuit arrangement which is electrically equivalent to said data buffer control logic circuit and causes substantially the same signal delay as that caused by said data buffer control logic circuit.

18. A semiconductor storage device comprising:

a memory cell array having a plurality of memory cells connected to a plurality of bit lines;

column selection gates each provided for a corresponding one of the bit lines to select the bit line;

a column decoder which generates a column selection signal for selectively driving said column selection gates;

data buffers each of which is provided for a corresponding one of said column selection gates, receives data output from said corresponding column selection gate, and amplifies and outputs the data;

a data buffer control logic circuit which generates data buffer drive signals for selectively driving said data buffer;

a first level shifter which receives a timing signal that has a second voltage at high level, and outputs the timing signal upon boosting the second voltage to a first voltage;

a first delay compensation circuit which receives a first power supply voltage having the first voltage and the timing signal output from said level shifter and outputs a first output signal delayed by a first predetermined time;

a second level shifter which receives the first output signal that has the first voltage at high level and output from said first delay compensation circuit, and outputs the first output signal to said data buffer control logic circuit upon boosting the first voltage to the second voltage;

a second delay compensation circuit which receives the second power supply voltage and the timing signal that has the second voltage at high level, and outputs a second output signal delayed by a second predetermined time; and a third level shifter which receives the second output signal output from said second delay compensation circuit, boosts the second voltage of the second output signal of high level to the first voltage, and outputs the signal to said column decoder.

19. A device according to claim 18, wherein said column decoder is configured to receive a column address and generate the column selection signal by decoding in accordance with the timing signal, said first delay compensation circuit is configured to receive the first power supply voltage in place of the column address, perform decoding in accordance with the timing signal, and output a result to said data buffer control logic circuit;

said data buffer control logic circuit includes a first latch circuit which receives an output control signal, holds the signal, and outputs the signal, and a first operation element which receives the output control signal output from said first latch circuit and the timing signal, calculates an AND thereof, and outputs the data buffer driving signal; and said second delay compensation circuit includes a second latch circuit which receives the second power supply voltage in place of the output control signal, holds the voltage, and outputs the voltage, and a second operation element which receives the second power supply voltage output from said second latch circuit and the timing signal, calculates an AND thereof, and outputs the AND to said column decoder.

20. A device according to claim 18, wherein said first delay compensation circuit has a circuit arrangement which is electrically equivalent to said column decoder and causes substantially the same signal delay as that caused by said column decoder, and said second delay compensation circuit has a circuit arrangement which is electrically equivalent to said data buffer control logic circuit and causes substantially the same signal delay as that caused by said data buffer control logic circuit.

21. A semiconductor storage device comprising:

a memory cell array having a plurality of memory cells connected to intersections of a plurality of word lines and a plurality of bit lines;

a row decoder which generates a word line selection signal for selectively driving the word lines;

sense amplifiers each of which is provided for a corresponding one of the bit lines, detects data output from the corresponding bit line, and output the data;

a sense amplifier control circuit which generates a sense amplifier driving signal for selectively driving said sense amplifiers;

a first level shifter which receives a timing signal that has a second voltage at high level, and outputs the timing signal upon boosting the second voltage to a first voltage;

a first delay compensation circuit which receives a first power supply voltage having the first voltage and the timing signal output from said level shifter and outputs a first output signal delayed by a first predetermined time;

a second level shifter which receives the first output signal that has the first voltage at high level and output from said first delay compensation circuit, and outputs the first output signal to said data buffer control logic circuit upon boosting the first voltage to the second voltage;

a second delay compensation circuit which receives the second power supply voltage and the timing signal that has the second voltage at high level, and outputs a second output signal delayed by a second predetermined time; and a third level shifter which receives the second output signal output from said second delay compensation circuit, boosts the second voltage of the second output signal of high level to the first voltage, and outputs the signal to said column decoder.

22. A device according to claim 21, wherein said row decoder is configured to receive a row address and generate the word line selection signal by decoding in accordance with the timing signal, said first delay compensation circuit is configured to receive a predetermined voltage in place of the row address, perform decoding in accordance with the timing signal, and output a result to said level shifter;

said sense amplifier driving circuit includes a first latch circuit which receives a sense amplifier activation signal, holds the signal, and outputs the signal, and a first operation element which receives the sense amplifier activation signal output from said first latch circuit and the timing signal, calculates an AND thereof, and outputs the sense amplifier driving signal; and said second delay compensation circuit includes a second latch circuit which receives the second power supply voltage in place of the sense amplifier activation signal, holds the signal, and outputs the signal, and a second operation element which receives the second power supply voltage output from said second latch circuit and the timing signal, calculates an AND thereof, and outputs the AND to said third level shifter.

23. A device according to claim 21, wherein said first delay compensation circuit has a circuit arrangement which is electrically equivalent to said row decoder and causes substantially the same signal delay as that caused by said row decoder, and said second delay compensation circuit has a circuit arrangement which is electrically equivalent to said sense amplifier control circuit and causes substantially the same signal delay as that caused by said sense amplifier control circuit.

* * * * *